United States Patent
Blom et al.

(10) Patent No.: US 8,120,084 B2
(45) Date of Patent: Feb. 21, 2012

(54) FERRO-ELECTRIC DEVICE AND MODULATABLE INJECTION BARRIER

(75) Inventors: Paulus Wilhelmus Maria Blom, Zuidhorn (NL); Bert de Boer, Zevenhuizen (NL); Kamal Asadi, Groningen (NL)

(73) Assignee: Rijksuniversiteit Groningen, Groningen (NL)

( * ) Notice: Subject to any disclaimer, the term of this patent is extended or adjusted under 35 U.S.C. 154(b) by 0 days.

(21) Appl. No.: 12/601,243

(22) PCT Filed: May 22, 2008

(86) PCT No.: PCT/NL2008/050302
§ 371 (c)(1),
(2), (4) Date: Nov. 20, 2009

(87) PCT Pub. No.: WO2008/143509
PCT Pub. Date: Nov. 27, 2008

(65) Prior Publication Data
US 2010/0171103 A1      Jul. 8, 2010

(30) Foreign Application Priority Data

May 22, 2007 (EP) .................. 07108645

(51) Int. Cl.
*H01L 29/76* (2006.01)
(52) U.S. Cl. ........ 257/298; 257/306; 257/307; 257/309; 257/310; 257/E27.016
(58) Field of Classification Search ............. 257/298, 257/306, 307, 309, 310
See application file for complete search history.

(56) References Cited

U.S. PATENT DOCUMENTS

| | | | |
|---|---|---|---|
| 6,013,950 A * | 1/2000 | Nasby | 257/734 |
| 6,753,562 B1 * | 6/2004 | Hsu et al. | 257/295 |
| 2009/0039341 A1 * | 2/2009 | Marsman et al. | 257/40 |

FOREIGN PATENT DOCUMENTS

| WO | WO 02/43071 A | 5/2002 |
|---|---|---|
| WO | WO 2005/121217 A | 12/2005 |
| WO | WO 2006/045764 A | 5/2006 |

OTHER PUBLICATIONS

Cheng Huang et al: "High Dielectric Constant Polymer Nano—Composites Actuator Materials," Electrets, 2005 ISE-12. 2005 $12^{TH}$ International Symposium on Salvador, Bahia, Brazil Sep. 11-14, 2005, Piscataway, NJ, USA, IEEE, Sep. 11, 2005, pp. 91-94.

Huang Cheng et al: "Colossal dielectric and electromechanical responses in self-assembled polymeric nanocomposites" Applied Physics Letters, AIP, American Institute Of Physics, Melville, NY, US, vol. 87, No. 18, Oct. 24, 2005, pp. 182901-182901.

International Search Report for PCT/NL2008/050302 dated Jul. 30, 2008.

* cited by examiner

*Primary Examiner* — Wai Sing Louie
(74) *Attorney, Agent, or Firm* — Leydig, Voit & Mayer Ltd.

(57) ABSTRACT

Described is a modulatable injection barrier and a semiconductor element comprising same. More particularly, the invention relates to a two-terminal, non-volatile programmable resistor. Such a resistor can be applied in non-volatile memory devices, and as an active switch e.g. in displays. The device comprises, in between electrode layers, a storage layer comprising a blend of a ferro-electric material and a semiconductor material. Preferably both materials in the blend are polymers.

7 Claims, 5 Drawing Sheets

Figure 2A:
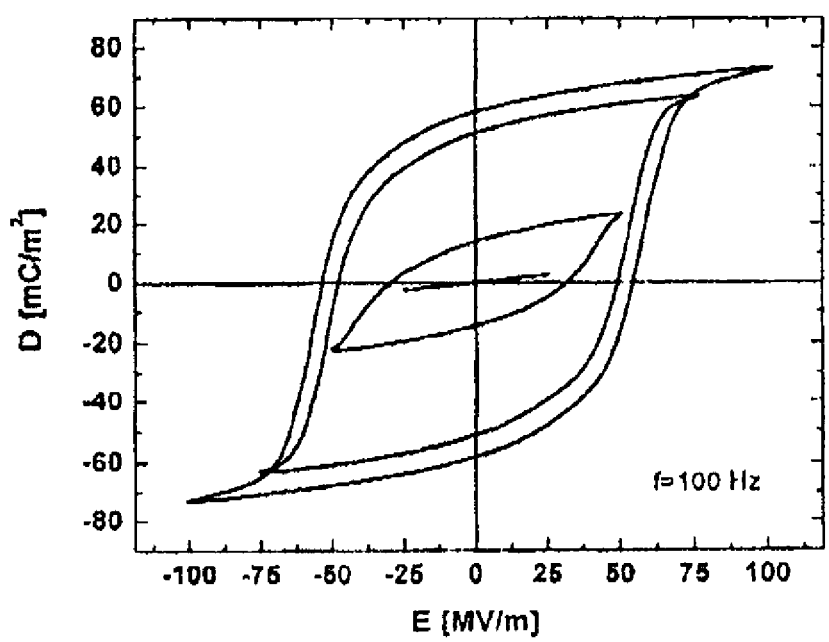

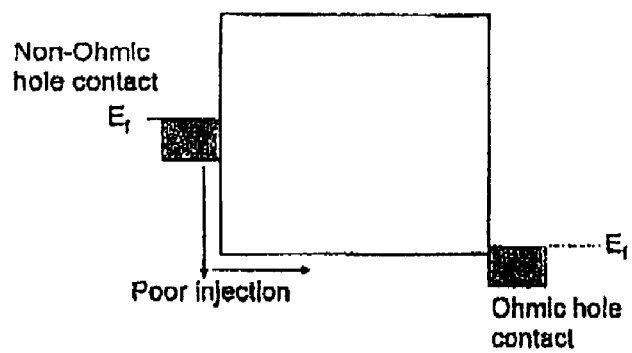
FIG. 1
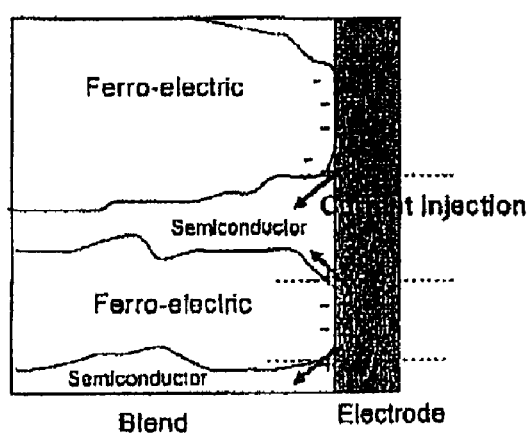
FIG. 1A
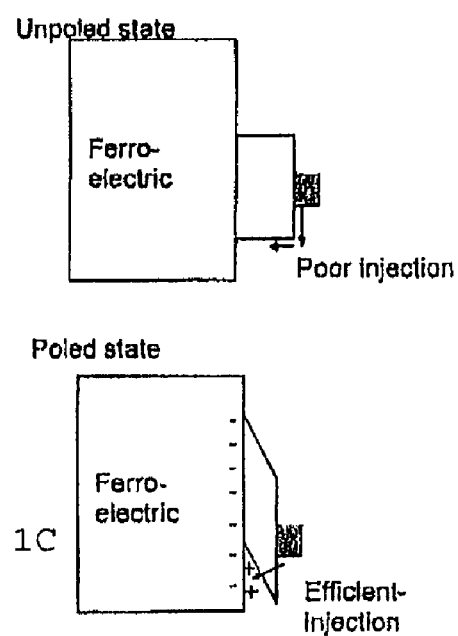
FIG. 1B
FIG. 1C

FERRO-ELECTRIC DEVICE AND MODULATABLE INJECTION BARRIER

FIELD OF THE INVENTION

The invention relates to a to a modulatable injection barrier and to a semiconductor element comprising same. More particularly, the invention relates to a two-terminal, non-volatile programmable resistor. Such a resistor can be applied in non-volatile memory devices, and as an active switch e.g. in displays. The invention also relates to programmable and rectifying diodes.

BACKGROUND TO THE INVENTION

Ferro-electric devices are employed as part of an electronic (e.g. computer) memory. Their function is based on an electronically programmed binary state (a "0" or a "1"), which can be read out electronically as well. A plurality of such devices is used to form a memory. The programming requires a voltage to polarize the ferro-electric material.

Non-volatile memory devices have the desired property that they will not loose their programmed state off-power. Conventional, non-volatile memory devices are not, however, intrinsically non-volatile. In the context of the invention, this means that the voltage needed for read-out will not change the polarized state of the device. I.e., each read-out of a device which is not intrinsically non-volatile, will have to be followed by step in which the device is polarized back again into the original state. This is a drawback, particularly in view of the limits the repeated poling puts on the life of the device.

A reference in this regard is a paper by Blom et al., Physical Review Letters, Volume 73, Number 15, 10 Oct. 1994, 2109, which describes a Schottky diode. More precisely, Blom describes a two-terminal memory device comprising
a first electrode;
a second electrode; and, adjacent to said electrodes,
a film of a ferro-electric semiconductor material, viz. $PbTiO_3$.

In this device, the binary states are determined by a high or a low conductance state of the ferro-electric semiconductor. This is neither practical, nor workable, as the conducting properties go at cost of the ferro-electric properties, i.e. this leads to a device which either cannot be polarized or cannot be read-out.

It is an object of the invention to provide an electrical switch which is intrinsically non-volatile. The high and low conductance state serve as the binary '1' or '0' (or vice versa) in a memory application, or as an active electrical switch to select, e.g. a display pixel. Further objectives are to increase storage density, to decrease the processing temperatures such that the fabrication of the non-volatile electrical switch is compatible with back-end silicon, to reduce the processing costs, and to realize an a-symmetrically switching diode (that is always in reverse in one bias direction).

Moreover, it is an object of the invention to provide a modulatable injection barrier (in effect mostly a modulatable electrode) that can be used not only in memory devices and switches, but also in other devices such as three terminal (field-effect) devices, and rectifying or light-emitting semiconductor diodes. More particularly, it is an object of the invention to provide organic semiconductor diodes which allow more than one programmed state (i.e. creating an asymmetrically switching diode).

Another object of the invention is to provide memory devices, notably if based on organic materials, which are capable of avoiding crosstalk.

As a further background on the use of organic semiconductor materials, the following references are referred to Cheng Huang et al., in Electrets 2005, pages 91-94, provides a nanocomposite having a high dielectric constant. Herein a high dielectric matrix polymer is provided with polyaniline conductive filler. With reference to the conductive filler concentration being close to the percolation concentration, the aim is to obtain a material of high dielectric constant that is particularly useful for its electromechanical response. The reference therewith does not relate to a modulatable injection barrier, as the aim of the document goes against obtaining a state of conductivity. Similar considerations hold for a reference by the same first author, in Applied Physics Letters, 87, 182901 (2005), pages 182901-1-1982901-3.

Background references on memory elements using ferro-electric polymers are WO 2006/045764 and WO 02/43071.

SUMMARY OF THE INVENTION

With the aim to meet one or more of the aforementioned objectives, the invention provides, in one aspect, a semiconductor element comprising at least one modulatable injection barrier, said barrier being formed between at least one electrode layer and a semiconductor layer, wherein the semiconductor layer comprises a blend of a semiconductor material and a ferro-electric material. The semiconductor element can be a device by itself, or can be used in semiconducting devices.

In a further aspect of the invention, the modulatable injection barrier serves, in various thinkable electronic devices, to program a memory device, to select a switch position, or to create a rectifying diode.

In another aspect, the invention provides a two-terminal non-volatile programmable resistor (to be used in e.g. electronic memory devices or in selection devices such as switches) comprising, preferably on a substrate:
(a) a first electrode layer;
(b) a second electrode layer; and, in contact with said electrode layers,
(c) a storage layer comprising
(d) a ferro-electric material,
which storage layer separates the first and second electrode layers from each other, i.e. sandwiched between the electrodes, wherein the storage layer comprises a blend of the ferro-electric material (d) with
(e) a semiconductor material.

The blend thus comprises a ferro-electric phase and a semiconductor phase. The invention allows both the semiconducting properties and the ferro-electric properties to be retained and optimised in one and the same device.

The device can be switched from one binary state to the other through polarization of the ferro-electric, using a relatively high first voltage $V_p$. As a result of the semiconducting phase, a relatively low second voltage $V_r$ can be applied to read-out the device. As $V_r$ is insufficient to re-polarize or de-polarize the ferro-electric, the device is intrinsically non-volatile.

In another aspect, the invention provides a two-terminal electrical switch comprising a storage layer sandwiched between first and second electrode layers, wherein the storage layer is a polymer layer comprising a blend of a ferro-electric polymer and a semiconductor polymer.

In another aspect, the invention provides a three-terminal device, comprising a blend of ferro-electric polymer and a semiconducting polymer as active layer on top of an insulating layer. The insulator is sandwiched between a gate electrode and the active layer, to which a source- and drain electrode are applied. By polarizing the ferro-electric via the gate electrode the injection barrier of either the source- or drain electrode or both is modulated, leading to a three terminal non-volatile memory device or a three terminal switch with improved switching characteristics in terms of on/off ratio and sub-threshold slope.

In another aspect, the invention provides a two-terminal memory device as described above, comprising a blend of a ferro-electric polymer and a semiconductor polymer and two asymmetrically switching electrodes.

In yet another aspect, the invention provides a memory cell comprising a plurality of memory devices having a storage layer as described above with reference to a blend of a ferro-electric material and a semiconductor material. Also in other devices, i.e. not only in memories, but also in e.g. light emitting diode arrays or displays, a plurality of semiconductor elements according to the invention can be applied.

In yet another aspect, the invention provides an electrical switch cell comprising a plurality of electrical switches having a storage layer as described above with reference to a blend of a ferro-electric material and a semiconductor material

DETAILED DESCRIPTION OF THE INVENTION

The various elements of the present invention are discussed hereinbelow.

In a general sense, the invention provides a modulatable injection barrier formed between an electrode layer and a semiconductor layer. The term "injection barrier" is known to the skilled person, and relates to the energy step or energy barrier that carriers (electrons or holes) have to overcome when being injected from an electrode into a semiconductor material at their interface.

The term "modulatable" refers to an injection barrier of which the required energy step for charge injection can be switched from a low to a high level. For a high energy barrier only few charge carriers can be injected into the semiconductor (low-conducting state), whereas for a low barrier a large amount of carriers can be injected, leading to a large current (conductive state).

To provide the modulatable injection barrier, according to the invention, the semiconductor layer comprises a blend of a semiconductor material and a ferro-electric material. Without theory to be considered as binding, it is believed that poling of the ferro-electric material, when in contact with the electrode, will allow carrier injection into the semiconductor material, in other words, will allow current to flow into the semiconductor material, in direct or indirect contact with the same electrode. The blend of the semiconductor material and the ferro-electric material thus serves as a storage layer preserving (unless and until reversed) either of two biases. The nature of the storage layer will be discussed further below.

This can also be applied vice versa, i.e. starting from a situation where a semiconductor has conducting properties, modulate the poling of the ferro-electric material so as to create a barrier for carriers to be injected into the semiconductor. The modulatable injection barrier of the invention thus allows, e.g., a "good" contact (i.e. an electrode-semiconductor interphase at which current readily flows) to be transformed into a "bad" contact (i.e. an interphase at which current-flow is low or zero), or vice versa. The skilled reader will understand that variants between "good" and "bad" contacts are possible.

The modulatable injection barrier is particularly useful in organic or polymeric light-emitting diodes (OLEDs or PLEDs). These diodes on one side have an electron-injecting contact, which, to be efficient, is usually made of reactive materials such as barium or calcium, which generally is adverse to the stability of the LED. By virtue of the invention, a non-reactive contact can be used, e.g. aluminum, which by itself is not a good injector of electrons. In conjunction with the ferro-electric, as foreseen in the invention, the electron injection from the non-reactive electrode is brought to a much higher level, as a non-reactive replacement of electrodes made of such reactive materials as calcium and barium.

The modulatable injection barrier of the invention also serves, e.g., to program a memory device or to select a switch position in a selection device. Particularly for the latter two devices, the invention, in one embodiment, can be described as a two-terminal non-volatile electrical switch comprising (a) a first electrode layer; (b) a second electrode layer; and, in contact with said electrode layers, (c) a storage layer comprising (d) a ferro-electric material, which storage layer separates the first and second electrode layers from each other, wherein the storage layer comprises a blend of the ferro-electric material (d) with (e) a semiconductor material.

The electrodes (a) and (b) are regular components of memory devices, switches, transistors, light-emitting diodes and the like. The same electrode materials can be used which are well-known for semiconductor devices such as transistors, diodes, et cetera. Suitable materials include tungsten, silver, copper, titanium, chromium, cobalt, tantalum, germanium, gold, aluminum, magnesium, manganese, indium, iron, nickel, palladium, platinum, zinc, alloys of the foregoing metals, aluminum, lithium, sodium, barium, calcium, lithiumfluoride, indium-tin oxide, other conductive and semi-conductive metal oxides, nitrides and silicides, polysilicon, doped amorphous silicon, and various metal composition alloys. Also, doped or undoped conducting or semi-conducting polymers, oligomers, and monomers can be used for the electrodes, such as poly(3,4-ethylenedioxy thiophene): poly (styrene sulphonate) (PEDOT:PSS), polyaniline, polythiothene, polypyrrole, and derivatives thereof. Electrodes can comprise one or more layers of different materials, or blends from different materials.

The electrodes (a) and (b) can be identical leading to symmetrical devices or dissimilar yielding asymetric current transport Preferably, the electrodes are made of metals that do not form Ohmic contacts with the semiconductor. These enhance the switching functionality of the devices.

The electrodes are applied in a practical order, preferably as most logically going with building up the device on a substrate. Thus, the first electrode layer (a) is applied on a substrate, e.g. by evaporation. As a next layer, the storage layer is applied comprising a blend as described above. In making the device, a practical advantage is obtained by choosing polymer materials for the blend, as these can be applied with relative ease, and in desired thicknesses, by techniques known in the art of organic and polymer devices, such as spin-coating or printing.

Before further processing, the storage layer may or may not desire, or require, a further treatment, e.g. annealing a polymer blend as known for ferro-electric polymers. The ferro-electric properties are enhanced when these polymers are crystallized above the Curie temperature.

In the specific embodiment described, with a substrate on which the first electrode layer (a) and the storage layer (c) are consecutively applied, on top of the storage layer the second electrode (b) is applied, which can be done in the same fashion as discussed for the first electrode layer (a).

While the devices according to the invention can be built-up each individually, it is preferred to create the layer structure of the invention for a plurality of devices simultaneously. To this end either or both of the electrode layers can be provided with shapes commensurate with any desired circuitry in which the memory devices of the invention are used. Preferably, the device is built up so as to have crossing bars of electrodes. In order to prevent cross-talk between the devices it is important that in both the high and low conductance state the current in reverse bias is low. It should be noted that the invention provides a great advantage over previous organic memory devices, as these generally are not rectifying, i.e. prone to cross-talk by allowing current to flow in either direction. The memory devices of the present invention, also when based on organic materials, can be set by poling the ferroelectric, to allow current-flow in one direction only.

The storage layer can be a single layer comprising the blended semiconductor and ferro-electric phases. It can also comprise several sublayers of the same blend, or several sublayers of different blends.

The storage layer typically has a thickness of 50-500 nm and preferably about 100 nm.

The storage layer comprises a blend of a ferro-electric material and a semiconductor material. Although this blend can be made of inorganic materials, e.g. by co-evaporation, it is much preferred to use organic materials.

Suitable inorganic ferro-electric materials include PbTiO3, BaTiO3. Suitable inorganic semiconductor materials include silicon, gallium, arsenide.

Preferably, the ferro-electric material and the semiconductor material are organic materials. Most preferably, the organic materials are polymeric materials.

Suitable organic ferro-electric materials are nylons and most preferably poly vinylidene fluoride co polymer with trifluoroethylene (P(VDF-TrFE)). Materials can be either high- or low molecular weight as long as they are ferroelectric. Also electrets can be used in stead of ferro-electric materials because their polarization can be switched using an applied electric field.

Suitable semiconductor materials are organic materials such as fullerenes, pyrilenes, phthalocyanines, oligomers of thiophenes, phenylenes and phenylenes vinylenes. Suitable semi-conductor polymers, as preferred, are poly(3-alkylthiophene)s, poly(dialkoxy phenylene vinylene)s, poly(aniline)s, poly(thiophenes), poly(phenylene)s, poly(phenylene ethylene)s, poly(pyrole)s, poly(furna)s, poly(acetylene)s, poly(arylenmethine)s, poly(isothianaphthene)s, poly(fluoren)s, and most preferably region-irregular poly 3-hexyl-thiophene rir-P3HT. As an alternative, also solution processable inorganic semiconducting nanoparticels as ZnO, TiO2, CdS, CdSe etc. can be used in a blend with a soluble ferroelectric layer.

The preferred polymers have the respective structures of formulae I and II below.

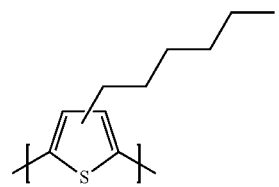

Regio-irregular poly(3-hexyl thiophene), rir-P3HT or P3HT

Formula I P(VDF-TrFE)

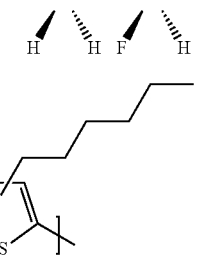

Regio-irregular poly(3-hexyl thiophene), rir-P3HT or P3HT

Formula II P3HT

In another embodiment, a copolymer is used to provide both of the properties needed in the storage layer, viz. a block copolymer having a semiconducting block and a ferro-electric block. Preferably such a co-polymer is crystallized with both blocks neatly alternating, so as to provide an optimal blend according to the invention.

It should be noted that the term "blend" has a broad meaning, indicating true blends of polymers, copolymers, or interpenetrating polymer networks (IPNs) of such a type as to still comprise separate phases of the semiconductor polymer and the ferro-electric polymer.

In the blend, the ferro-electric polymer is present in at least a sufficient extent to allow that a polarization charge can be measured (i.e. otherwise the material would no longer be a ferro-electric). The semiconductor polymer is present in an amount at least sufficient to allow a path through the blend for travel of a charge carrier between the electrodes.

More particularly, the ferro-electric material (d) and the semiconductor material (e) can be blended in a ratio, by weight, of (d): (e) ranging from 1:1 to 1000:1, preferably of from 10:1 to 100:1. In order to prevent some semiconductor polymers, such as rir-P3HT, to form aggregates or to macrophase separate, it is preferred of these polymers are present in not too high an amount, preferably calling for ratios of (d):(e) of from 20:1 to 50:1, more preferably of from 20:1 to 40:1.

It is also possible to provide, in the storage layer, a continuous first phase of an organic material having either of the semiconductor or ferro-electric properties, and contained in this, the second phase of an inorganic material having the other of the semiconductor or ferro-electric properties. As an example a ferro-electric can be prepatterned with nanometer sized holes that are filled with an (in)organic semiconductor.

The processing is facilitated using a common solvent for both ferro-electric and semiconductor to obtain an intimate morphology. Furthermore, addition of compatibilizers might be helpful as commonly used in blends of two polymers.

In order to change the switching characteristics additional semiconductor layers can be added between the active (blend) layer and electrodes The devices of the invention can be advantageously used in memory cells. As is practically preferable, the invention thus also relates to a plurality of injection barriers and devices.

It is to be understood that the invention is not limited to the embodiments and formulae as described hereinbefore. It is also to be understood that in the claims the word "comprising" does not exclude other elements or steps. Where an indefinite or definite article is used when referring to a singular noun e.g. "a" or "an", "the", this includes a plural of that noun unless something else is specifically stated.

The invention will be illustrated with reference to the following, unlimitative Examples and the accompanying Figures.

FIGURES

FIG. 1 shows a band diagram associated with a non-Ohmic contact (Fermi-level not aligned with the valence—or conduction band) and an Ohmic contact (Fermi-level aligned).

FIG. 1a shows a cross-section of a part of an injection barrier according to the invention. In white, it depicts part of a blend of semiconductor material and ferro-electric material (indicated with words). In grey it depicts part of an electrode. As is shown, a poling of the ferro-electric material results at the boundary of the ferro-electric material and the electrode in opposite charges (depicted as a negative charge (−) at the ferro-electric side and a positive charge (+) at the electrode side). The arrows pointing from the electrode into the direction of the semiconductor material show (as also indicated in words) the injection of charge into the semiconductor material. The figure also contains dashed lines, to indicate the source for band diagrams as depicted in FIG. 1b and 1c. FIGS. 1b and 1c show band diagrams as will be valid for the positions of the dashed lines drawn in FIG. 1a. The horizontal lines stand for the valence band (low) and the conduction band (high), of the ferro-electric on the left (with the larger band gap) and the semiconductor on the right (with the smaller band gap), grey being the electrode.

The band diagram shown in FIG. 1b is valid for the unpoled state of the ferro-electric. The arrows from the electrode into the direction of the ferro-electric, display the inadequacy of carriers to be injected into the semiconductor material (indicated as "poor injection").

The band diagram shown in FIG. 1c is valid for the poled state of the ferro-electric, i.e. the situation shown in FIG. 1a. The poling of the ferro-electric results in a sufficient countercharge at the electrode so as to surmount the energy barrier with the semiconductor material, allowing charge carriers to flow into same (indicated as "efficient injection").

FIG. 2. shows (a) Ferroelectric hysteresis loop of P(VDF-TrFE) polymer, sandwiched between two silver electrodes, using a Sawyer-Tower technique (b) C-V measurements of the devices with different blending ratio.

Figure 3A:
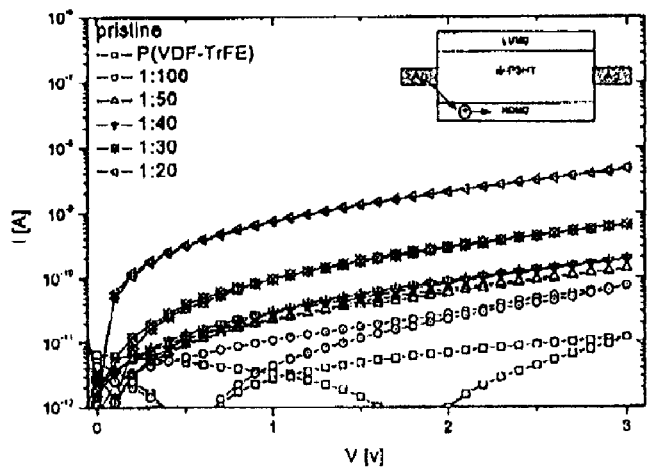
Figure 3B:
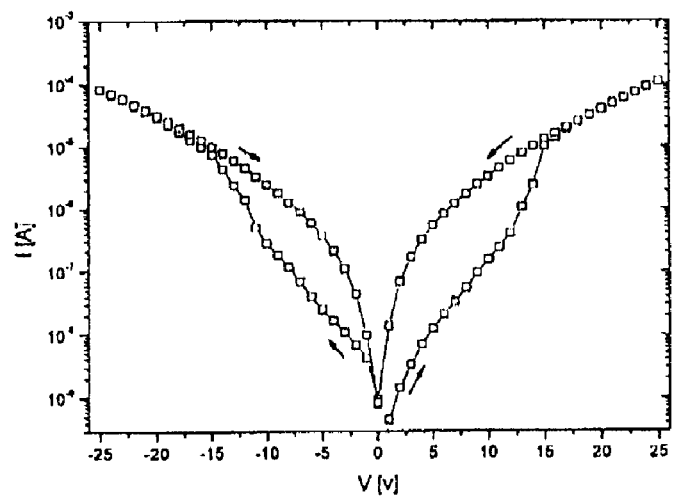
Figure 3C:
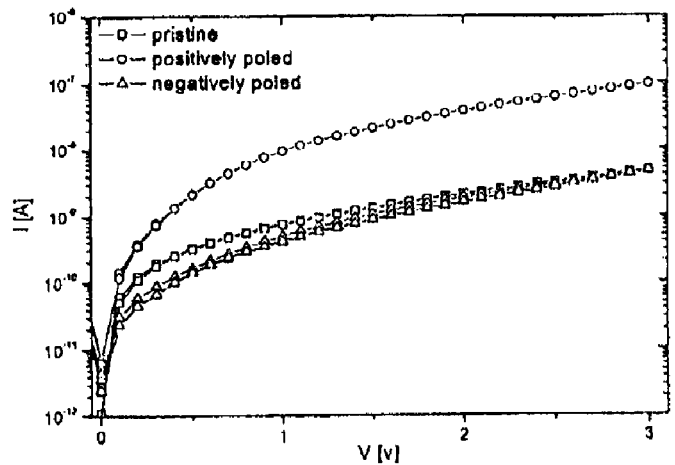

FIG. 3. shows IV characteristics of a devices with 1 mm² area. (a) pristine devices (before poling) with different blending ratios varying from device with only P(VDF-TrFE) to 1:20 rir-P3HT:P(VDF-TrFE) and (b) IV sweep for the 1:20 device, showing the hysteresis in current at two different operating states. (c) comparison of the current for a pristine, positively poled and negatively poled device with 1:20 blend.

Figure 4:
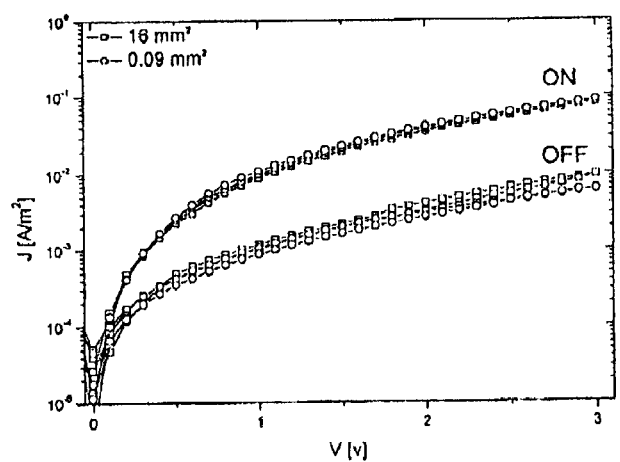

FIG. 4. shows current scaling with area; current density for both ON and OFF states lie on top of each other for two different device areas.

Figure 5:
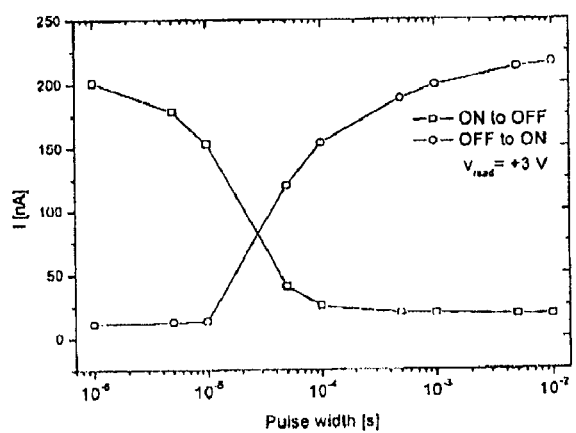

FIG. 5. shows programming time measurement to bring the device from OFF to ON state and vice versa with a ±30 V signal with different width.

Figure 6:
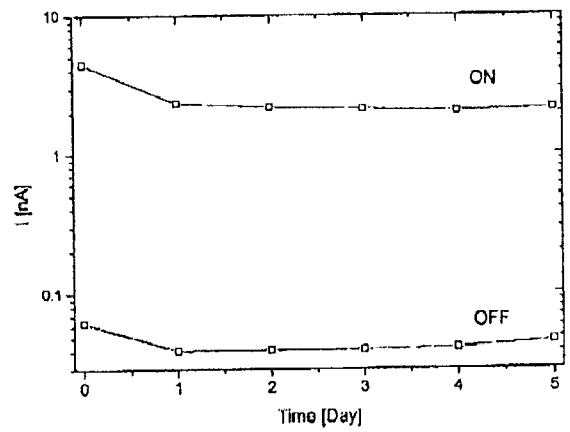

FIG. 6. shows data retention time.

Figure 7:
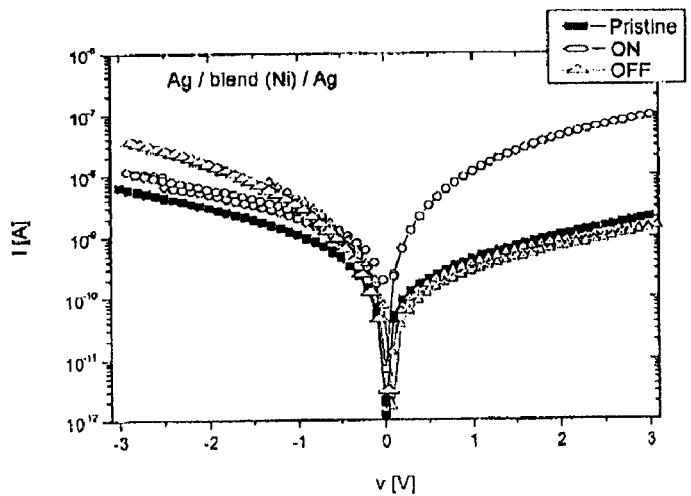
Figure 7:
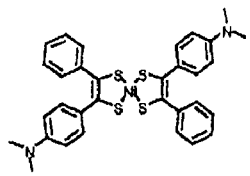

FIG. 7. shows IV characteristics of a blend where the rir-P3HT is replaced by Ni-dithielene. The blend consists of P(VDF-TrFE) 65%-35% with 5% of the Ni-complex, sandwiched between two Ag electrodes. The chemical structure of Ni-dithielene is also shown.

Figure 8:
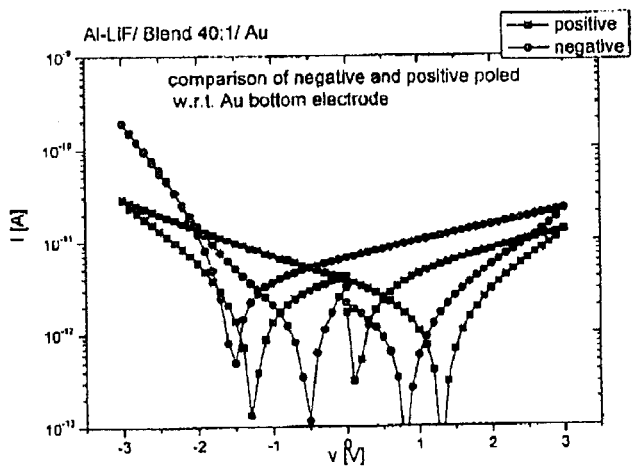

FIG. 8. shows the I-V characteristics of a blend 1:40 rir-P3HT:P(VDF-TrFE) with asymmetric electrodes. As a bottom electrode Au is used, and as a top electrode LiF/Al is used. Upon poling the injection of holes from the Au into rir-P3HT is modified (negative bias), whereas the injection of holes from the LiF/Al is always blocked.

EXAMPLES

Example 1

On a cleaned glass substrate, first 1 nm of chromium followed by 20-50 nm of silver (or gold) is evaporated. Then the solution is spin coated and a thin film of the storage medium is formed. The stack is annealed for 2 hours at 140° C. in a vacuum oven in order to enhance the ferroelectric phase of the P(VDF-TrFE) subphase. Then, a metal electrode is evaporated on top of the film using a shadow mask.

Solutions with 50 mg/ml concentration of only P(VDF-TrFE) in tetrahydrofuran (THF), 1:100 rir-P3HT/P(VDF-TrFE), i.e. 1 mg rir-P3HT added to 100 mg P(VDF-TrFE) dissolved in 2 ml THF, as well as 1:50, 1:40, 1:30 and 1:20, and 1:10 are made.

Results

First the properties of a device with only the ferroelectric (P(VDF-TrFE)) (65-35) sandwiched between two silver electrodes are characterized using a Sawyer-Tower circuit. FIG. 2(a) shows the typical hysteresis loop for this ferroelectric polymer at different voltages at a frequency of 100 Hz. The coercive field is about 50 MV/m and the remnant polarization is around 60 mC/m².

Having characterized the ferroelectric properties of the pure ferroelectric material as a next step devices fabricated with different blends ratio's of rir-P3HT and P(VDF-TrFE) are investigated. Two main issues are addressed: ferroelectricity and the device conductivity due to presence of rir-P3HT.

Figure 2B:
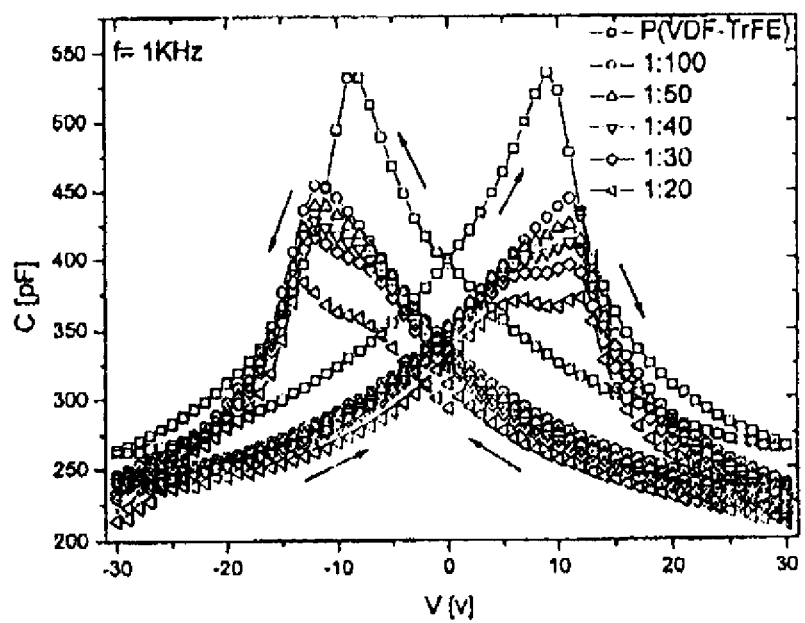

FIG. 2(b) shows the capacitance of the devices from CV measurement, for different blending compositions. Silver and gold are used as bottom and top contacts, respectively. The device with only P(VDF-TrFE) shows the expected butterfly-shape CV for a ferroelectric material. When adding the semiconducting rir-P3HT two features are observed; First the capacitance decreases with increasing rir-P3HT content in the film. Secondly, the switching voltage increases as compared to a pure P(VDF-TrFE) device. Since all the blend devices show nearly the same CV behavior as the pristine ferro-electric device it can be concluded from FIG. 2(b) that in the blend the ferro-electricity is still present in all blends, even in the case of 1:10.

Having demonstrated the presence of ferroelectricity in the blend films the current transport through the devices is investigated. FIG. 3(a) shows the current for devices with different ferro-electric:semiconductor ratio with both silver bottom and top electrodes before poling (pristine current). As expected, the current scales with the amount of rir-P3HT in the film, increasing from the leakage current of the P(VDF-TrFE) only device towards a maximum of 10 µA for the 1:10 rir-P3HT:P(VDF-TrFE) device. Since the structure of the device in this case is symmetric (Ag/(rir-P3HT:P(VDF-TrFE))/Ag), being injection limited on both sides, a symmetric IV curve is expected. This is only valid for unpoled pristine devices. In a poled device, the IV curve as is shown in FIG. 3(b) becomes asymmetric due to the ferroelectric polarization.

Switching Mechanism:

In order to inject charges into a semiconductor an Ohmic contact is required of which the Fermi-level aligns with the valence- or conduction. When the fermi-level is not aligned, the injection of charge carriers is inefficient. Then the current in the device is low and limited by the charge injection process. (FIG. 0). In the present invention the ferro-electric polarization charge is used to enhance the charge injection into the semiconductor of an injection limited device. In FIG. 1a the blend of a ferro-electric material and a semiconductor is schematically represented. Semiconducting percolated pathways of the semiconductor exist to transport the injected charges to the other electrode. For an unpoled ferro-electric the electrode is not capable of efficient charge injection into the semiconductor. However, when the ferro-electricum is poled charges will accumulate both in the semiconductor and/or the metal electrode in order to neutralize the ferro-electric polarization charges (see FIG. 1c). These accumulated charges induce a strong bending of the energy bands close to the ferro-electric semiconductor interface (within a few nm), leading to an enhanced charge injection.

It is not obvious whether the ferro-electric polarization can also switch an Ohmic contact off. In that case, charges of the opposite sign need to be accumulated, which can not be easily injected from the contact. First experiments with Ohmic gold contacts indeed showed that the injection can also be reduced by poling in the opposite direction.

The conductance switching, due to the ferroelectric switching of the devices, paves the way toward the fabrication of extremely simple, low cost, and high density non-volatile memory cells by solution processing. To support this proposition, parameters such as area scaling, switching time and retention time of the devices need to be considered. FIG. 4 shows current scalability for devices with different area. This assures that on one hand conduction is due to transport through rir-P3HT, and on the other hand demonstrates the ability for downscaling the devices which is very important for high density memory applications.

Another crucial parameter to compare with the competing technologies is the programming time of the devices, that is how fast the polarization switches or in the other word the device is turned ON and OFF. In order to measure the programming time, a pulse of −30V amplitude is applied across the device to switch it into the OFF state. Then a pulse of the same amplitude and opposite polarity with a certain width in time is applied to switch the device back to the ON state. After this procedure the current is measured. This cycle is repeated several times, each time using a different width for the positive pulse to retrieve an on/off ratio larger than 10. FIG. 5 shows the programming time of the device. For a pulse width of 0.5 ms the on/off ratio of 10 is retrieved. We conclude therefore that the programming time of our devices amounts to typically ~0.5 ms.

In FIG. 6 the retention time of the device is demonstrated. The observed long retention time is due to the polarization stability of the ferroelectric. Therefore, as long as the ferro-electric retains its polarization, which is at least a few years for P(VDF-TrFE), the device will be able to maintain its on/off ratio as long as the semiconductor (in our case rir-P3HT) does not degrade. Retention measurements are currently carried out on two different devices; one is held in the on-state and the other in the off-state. Both of them did not show any sign of degradation after four months.

An important issue is whether the concept of a modulatable injection barrier is universal and valid for a large number of ferro-electric semiconductor combinations. In FIG. 7 the IV characteristics are shown for a device in which the polymeric semiconductor rir-P3HT is replaced by another organic semiconductor, the molecule Ni-dithielene. The blend consists of P(VDF-TrFE) 65%-35% with 5% of the Ni-complex, sandwiched between two Ag electrodes. The switching behaviour is identical to the rir-P3HT devices and shows that the concept of a modulatable injection barrier is not limited to only one specific materials combination.

For arrays of memory devices it is important to avoid cross-talk between the memory elements. The way to circumvent cross-talk is to make a diode of which the resistance is only modulated in forward bias. In reverse bias the diode should always be closed. In FIG. 8 the I-V characteristics of a blend 1:40 rir-P3HT:P(VDF-TrFE) with asymmetric electrodes are shown. As a bottom electrode Au is used, which is a good hole injecting contact. As a top electrode the low work function LiF/Al is used, which is a very poor hole injector. Upon poling the injection of holes from the Au into rir-P3HT is modified (negative bias), whereas the injection of holes from the LiF/Al is always blocked, independent of the poling direction. This example shows that it is possible to fabricate a programmable rectifying diode of which the current is only modulated in forward bias, in reverse the current is always off.

A large disadvantage of organic light-emitting diodes is that a reactive metal is required to efficiently inject electrons. We have demonstrated that efficient electron injection can also be achieved from an intrinsically bad injecting contact. This was realized using a ferro-electric:semiconductor MEH-PPV blend together with an Al electrode modify the electron injection.

The invention claimed is:

1. A use, in a semiconductor element, of a blend of a semiconductor material and a ferro-electric material to provide a modulatable injection barrier, said modulatable injection barrier being an energy barrier that electrons or holes overcome when injected from an electrode into a semiconductor material, at the interface of the electrode and the semiconductor material, said modulatable injection barrier being formed between at least one electrode layer and a semiconductor layer, wherein the semiconductor layer comprises said blend, and modulation of the modulatable injection barrier being performed by modulating poling of the ferro-electric material.

2. The use according to claim 1, wherein the ferro-electric material and the semiconductor material are organic materials.

3. The use according to claim 2, wherein the ferro-electric material is a nylon.

4. The use according to claim 2, wherein the semiconductor material is:
   an organic material selected from the group consisting of: fullerenes, pyrilenes, phthalocyanines, oligomers of thiophenes, phenylenes and phenylenes vinylenes; or
   a polymeric material selected from the group consisting of poly(3-alkylthiophene)s, poly(dialkoxy phenylene vinylene)s, poly(aniline)s, poly(thiophenes), poly(phenylene)s, poly(phenylene ethylene)s, poly(pyrole)s, poly(furna)s, poly(acetylene)s, poly(arylmethine)s, poly(isothianaphthene)s, poly(fluoren)s, and region—irregular poly 3-hexyl-thiophene rir-P3HT.

5. The use according to claim 2, wherein the blend of the semiconductor material and the ferro-electric material comprises a block copolymer having a semiconducting block and a ferro-electric block.

6. The use according to claim 2, wherein the blend of the semiconductor material and the ferro-electric material comprises an interpenetrating polymer network with separate polymer phases.

7. The use according to claim 2, wherein the ferro-electric material is a polyvinylidene fluoride copolymer with poly trifluoroethylene.

\* \* \* \* \*

UNITED STATES PATENT AND TRADEMARK OFFICE
CERTIFICATE OF CORRECTION

| | | |
|---|---|---|
| PATENT NO. | : 8,120,084 B2 | Page 1 of 1 |
| APPLICATION NO. | : 12/601243 | |
| DATED | : February 21, 2012 | |
| INVENTOR(S) | : Paulus Wilhelmus Maria Blom, Bert de Boer and Kamal Asadi | |

It is certified that error appears in the above-identified patent and that said Letters Patent is hereby corrected as shown below:

Title page

Item [73] "Rijksuniversiteit Groningen" should be --Nederlandse Organisatie voor toegepast-natuurwetenschappelijk Onderzoek TNO and Interuniversitair Microelectronica Centrum vzw.--.

Signed and Sealed this
Eleventh Day of September, 2012

David J. Kappos
*Director of the United States Patent and Trademark Office*